(12) United States Patent
Dieterich et al.

(10) Patent No.: US 9,513,569 B2
(45) Date of Patent: Dec. 6, 2016

(54) OPTICAL COLLECTOR FOR COLLECTING EXTREME ULTRAVIOLET RADIATION, METHOD FOR OPERATING SUCH AN OPTICAL COLLECTOR, AND EUV SOURCE WITH SUCH A COLLECTOR

(75) Inventors: Franz Dieterich, Nussbaumen (CH); Reza Abhari, Forch/ZH (CH); Andrea Giovannini, Lugano/TI (CH); Vipluv Aga, Zürich/ZH (CH)

(73) Assignee: ETH Zürich, Zürich (CH)

( * ) Notice: Subject to any disclaimer, the term of this patent is extended or adjusted under 35 U.S.C. 154(b) by 1110 days.

(21) Appl. No.: 13/635,851

(22) PCT Filed: Mar. 16, 2011

(86) PCT No.: PCT/EP2011/001305
§ 371 (c)(1),
(2), (4) Date: Sep. 18, 2012

(87) PCT Pub. No.: WO2011/113591
PCT Pub. Date: Sep. 22, 2011

(65) Prior Publication Data
US 2013/0003167 A1  Jan. 3, 2013

(30) Foreign Application Priority Data

Mar. 18, 2010  (EP) .................................. 10002866

(51) Int. Cl.
*G03F 7/20* (2006.01)
*B82Y 10/00* (2011.01)
*G21K 1/06* (2006.01)

(52) U.S. Cl.
CPC ........... *G03F 7/70891* (2013.01); *B82Y 10/00* (2013.01); *G03F 7/70175* (2013.01); *G21K 1/06* (2013.01);
(Continued)

(58) Field of Classification Search
CPC ................ G02B 7/181–7/1815; G02B 5/0891; H01S 3/04–3/042
(Continued)

(56) References Cited

U.S. PATENT DOCUMENTS 7,641,340 B2  1/2010  Ichikawa
8,810,775 B2 *  8/2014  Kools .................. G02B 5/0891
355/67
(Continued)

FOREIGN PATENT DOCUMENTS

DE  199 55 574 A1  7/2001
EP  1 376 185 A2  1/2003
(Continued)

OTHER PUBLICATIONS

Howells, M.R., "Some Fundamentals of Cooled Mirrors for Synchrotron Radiation Beam Lines", Optical Engineering vol. 35:4, Apr. 1996, pp. 1187-1197, Society of Photo-Optical Instrumentation Engineers, Bellingham.
(Continued)

*Primary Examiner* — Bumsuk Won
*Assistant Examiner* — Jeffrey Madonna
(74) *Attorney, Agent, or Firm* — Pauley Erickson & Rottis

(57) ABSTRACT

An optical collector (15) for collecting extreme ultraviolet radiation or EUV light generated at a central EUV production site comprises a reflective shell (25). To cope with thermal loading of the collector and avoid deformations, the reflective shell (25) is mounted on a support structure (24), such that a cooling channel (29) is established between the back side of the reflective shell (25) and the support structure (24), the thickness of the reflective shell (25) is substantially reduced, such that the convective heat transfer between the back side of the reflective shell (25) and a cooling medium (26) flowing through the cooling channel (29) dominates the process of removing heat from the reflective shell (25) with respect to heat conduction, and a cooling circuit (33) is connected to the cooling channel (29); to supply a cooling medium (26) to the cooling channel (29) with a controlled coolant pressure and/or mass flow.

13 Claims, 6 Drawing Sheets

(52) U.S. Cl.
CPC ... *G21K 2201/061* (2013.01); *G21K 2201/065* (2013.01)

(58) Field of Classification Search
USPC .................................................. 359/845–846
See application file for complete search history.

(56) References Cited

U.S. PATENT DOCUMENTS

| | | | |
|---|---|---|---|
| 2002/0113954 A1 | 8/2002 | Antoni et al. | |
| 2002/0185124 A1* | 12/2002 | Blackmon, Jr. | F24J 2/4647 126/680 |
| 2005/0284153 A1* | 12/2005 | Price | F25B 21/02 62/3.7 |
| 2006/0227826 A1 | 10/2006 | Balogh et al. | |
| 2007/0058244 A1 | 3/2007 | Singer | |
| 2009/0147386 A1* | 6/2009 | Sogard | G02B 7/1815 359/845 |
| 2009/0289205 A1 | 11/2009 | Moriya et al. | |
| 2010/0201958 A1* | 8/2010 | Hauf | G02B 7/008 355/30 |
| 2011/0051267 A1* | 3/2011 | Kierey | G02B 5/0891 359/845 |
| 2011/0128513 A1* | 6/2011 | Pedrali | C25D 1/02 355/30 |
| 2012/0212719 A1* | 8/2012 | Bianucci | G02B 5/09 355/67 |

FOREIGN PATENT DOCUMENTS

| | | |
|---|---|---|
| EP | 2 034 490 A1 | 3/2009 |
| JP | 8-211211 | 8/1996 |
| WO | WO 2006/091948 A2 | 8/2006 |
| WO | WO 2009/025557 A1 | 2/2009 |
| WO | WO 2010/017892 A1 | 2/2010 |

OTHER PUBLICATIONS

Frank Anthony, "High Heat Load Optics: An Historical Overview", Optical Engineering, v.34:2 pp. 313-320, Feb. 1995.

* cited by examiner

OPTICAL COLLECTOR FOR COLLECTING EXTREME ULTRAVIOLET RADIATION, METHOD FOR OPERATING SUCH AN OPTICAL COLLECTOR, AND EUV SOURCE WITH SUCH A COLLECTOR

BACKGROUND OF THE INVENTION

Field of the Invention

The present invention relates to the generation and processing of extreme ultraviolet radiation. It refers to an optical collector for collecting extreme ultraviolet radiation according to the preamble of claim 1. It further refers to a method for operating such an optical collector, and a EUV source with such a collector.

Discussion of Related Art

Extreme ultraviolet radiation (EUV) is emitted by hot dense plasmas which can be produced by exciting a target material e.g. tin, with a focused laser beam, creating a laser produced plasma (LPP). A part of the radiation emitted from this plasma is in the EUV spectrum of wavelengths between 10 and 100 nm. The major share of emitted energy lies outside this wavelength band, comprising ultraviolet, visible, infrared and reflected laser radiation. To achieve a high power output and a high brilliance of the radiation source, the emitted radiation is collected and collimated to an intermediate focus for further usage. This is done by ellipsoidal collector optics.

FIG. 7 shows a simplified configuration of a EUV source. The EUV source 10 comprises a chamber 11 containing an elliptic or nearly elliptic multilayer (Mo/Si) collector or mirror 15 and a target delivery system 17, which is attached to the chamber 11 by means of a mechanical support 16 and emits a chain of droplets 19 of the target material. A high power (100 W to 20 kW) and high repetition rate (10 Hz to 500 kHz) drive laser 12 ignites the target material at a EUV production site 20. The focused drive laser pulse 14 enters the chamber 11 through a flanged window 13. The spatial and temporal characteristics of the laser pulse match the target size and location in order to maximize conversion efficiency (CE), i.e. the ratio of EUV energy and laser energy. An optical system 23 is used to detect and control the droplets 19 coming from the target delivery system 17.

The collector 15 collects the EUV light 18 generated at the EUV production site 20. The collector 15 has a first focus at the EUV production site 20, and a second focus 21, called intermediate focus (IF), where the EUV light 18 is bundled for further use in a subsequent EUV lithography tool (not shown in FIG. 7). The collector 15 has an aperture 22 for the laser light to reach the EUV production site 20.

The EUV target delivery system 17 delivers the plasma source material to the EUV production or ignition site 20. The source material is in the form of liquid droplets 19 of either pure material, e.g. Sn, Xe or Li, or of a suspension of target material in a solution, e.g. water or alcohol. The delivery of the droplets 19 of source material takes place at a constant repetition rate and droplet or target size. Target sizes are in the range of 10-100 pm in order to minimize the amount of neutral particles being present after the plasma formation. As has been mentioned before, the targets or droplets 19 reach the EUV production site 20 at the first focal point of the EUV collector 15. Similar configurations are shown in documents WO 2006/091948(A1) or WO 2009/025557(A1) or WO 2010/017892(A1).

The out of band emissions which are partially absorbed in the reflective optics lead to increased temperatures of the collector surface. To avoid thermally induced deformations and a deterioration of the multilayer coating, the collector 15 has to be cooled. However, any gas absorbs the EUV radiation and therefore the radiation sources and collimating optics are operated in a vacuum. This prohibits convection cooling of the collector surface within the chamber 11. Therefore cooling has to be implemented in another way.

For a normal incidence collector the radiation hitting the collector surface is not homogeneous. Due to directionally varying emissions and varying distance between the collector surface and the plasma, there are regions of the collector surface with higher heat load than others, which results in temperature gradients across the surface. Both elevated temperature level and temperature gradients induce thermal stresses which lead to collector deformation.

Deformations of the collector surface can be reduced by a rigid design of the collector surface. The choice of material also has a strong influence on the deformations in operation. Mechanical forces on the reflective part of the collector can induce or compensate for deformations.

Document JP 8211211 proposes a design for high power laser optics, which are cooled from the back side. To avoid deformations of the reflective part by the pressure of the coolant the mirror is designed stiffer than the cooling ducts which mitigates all pressure induced deformations to the back structure.

Document DE 19955574(A1) describes a gas cooled reflector for high power laser radiation. The design is such, that the thickness of the reflector substrate is reduced to a minimum (e.g. 1 to 25 mm) to enhance convective cooling of the mirror without losing the required stiffness to prevent vibrations or deformations. Further a cooling scheme based on convection on the collector back side is proposed. Ribs, which are designed on the collector back side to enhance manufacturability, serve for cooling enhancement by surface extension and flow perturbation as a secondary benefit.

Documents US 2007058244(A1), US 2009289205(A1) and EP 2034490(A1) disclose normal incidence EUV collector designs and reflector arrangements, without any reference to thermal management, cooling or deformation control of the proposed optics.

Document U.S. Pat. No. 7,641,340(B1) describes a cooling setup for optical surfaces in near vacuum based on heat transfer through a liquid in a narrow gap between the back side of the optics surface and a temperature controlled member. This heat transfer is based on conduction and the liquid is kept in position by interfacial surface tension.

SUMMARY OF THE INVENTION

It is an object of the present invention to provide an optical collector, especially for being used in a EUV source, which is able to focus the collected radiation independent of the heat load on said collector during operation, and to provide a method for operating such an optical collector, and a EUV source with such an optical collector.

The optical collector according to the invention collects the extreme ultraviolet radiation or EUV light generated at a central EUV production site. The collector, which comprises a reflective shell, is characterized in that means are provided for compensating thermally induced deformations of the reflective shell.

According to an embodiment of the invention the reflective shell is mounted on and supported by a support structure, such that a cooling channel is established between the back side of the reflective shell and the support structure, that the thickness of the reflective shell is substantially reduced, such that the convective heat transfer between the back side of the reflective shell and a cooling medium flowing through the cooling channel dominates the process of removing heat from the reflective shell with respect to heat conduction, and that a cooling circuit is connected to the cooling channel to supply a cooling medium to the cooling channel with a controlled coolant pressure and/or mass flow and/or temperature.

According to another embodiment of the invention the reflective shell is of near ellipsoidal shape and axisymmetric with respect to an axis, and the cooling channel is funnel-shaped with respect to the axis.

According to another embodiment of the invention the cooling channel is connected to the cooling circuit through a plurality of inlet ports and exit ports.

According to another embodiment of the invention volutes are provided between the inlet ports and the cooling channel and the exit ports and the cooling channel.

According to another embodiment of the invention the cooling medium enters the cooling channel near the axis and exits the cooling channel far from the axis.

According to another embodiment of the invention flow disturbing means are provided at predetermined locations within the cooling channel.

According to another embodiment of the invention the flow disturbing means comprises a plurality of obstacles, especially in the form of turbulators, which are mounted on the side of the cooling channel opposite to the back side of the reflective shell and/or on the back side of the reflective shell.

According to just another embodiment of the invention the cooling circuit is a closed circuit comprising a heat exchanging means, a compressor and a control valve, whereby a control is provided for controlling the compressor and/or the control valve and/or the heat exchanging means.

The inventive method for operating the optical collector is characterized in that the pressure and/or the mass flow and/or the temperature of the cooling medium flowing through the cooling channel is used to compensate for thermally induced deformations of the reflective shell.

According to an embodiment of the inventive method the pressure and/or the mass flow and/or the temperature of the cooling medium is controlled in dependence of an input signal being characteristic of a deformation of the reflective shell.

According to another embodiment of the inventive method a gas is used as the cooling medium.

According to just another embodiment of the inventive method the gas is one of the gases including hydrogen, helium, argon, neon, krypton, xenon, chlorine, nitrogen, fluorine, bromine, and iodine, or a mixture of two or more of said gases.

The EUV source according to the invention comprises a target delivery system, which emits a chain of droplets of the target material, a high power drive laser, which ignites the target material at a EUV production site, and an optical collector, which collects the EUV light generated at the EUV production site, whereby the optical collector is a collector according to the invention.

BRIEF DESCRIPTION OF THE DRAWINGS

This invention is explained in greater detail below in view of exemplary embodiments shown in the drawings, wherein.

DETAILED DESCRIPTION OF THE INVENTION

Figure 1:
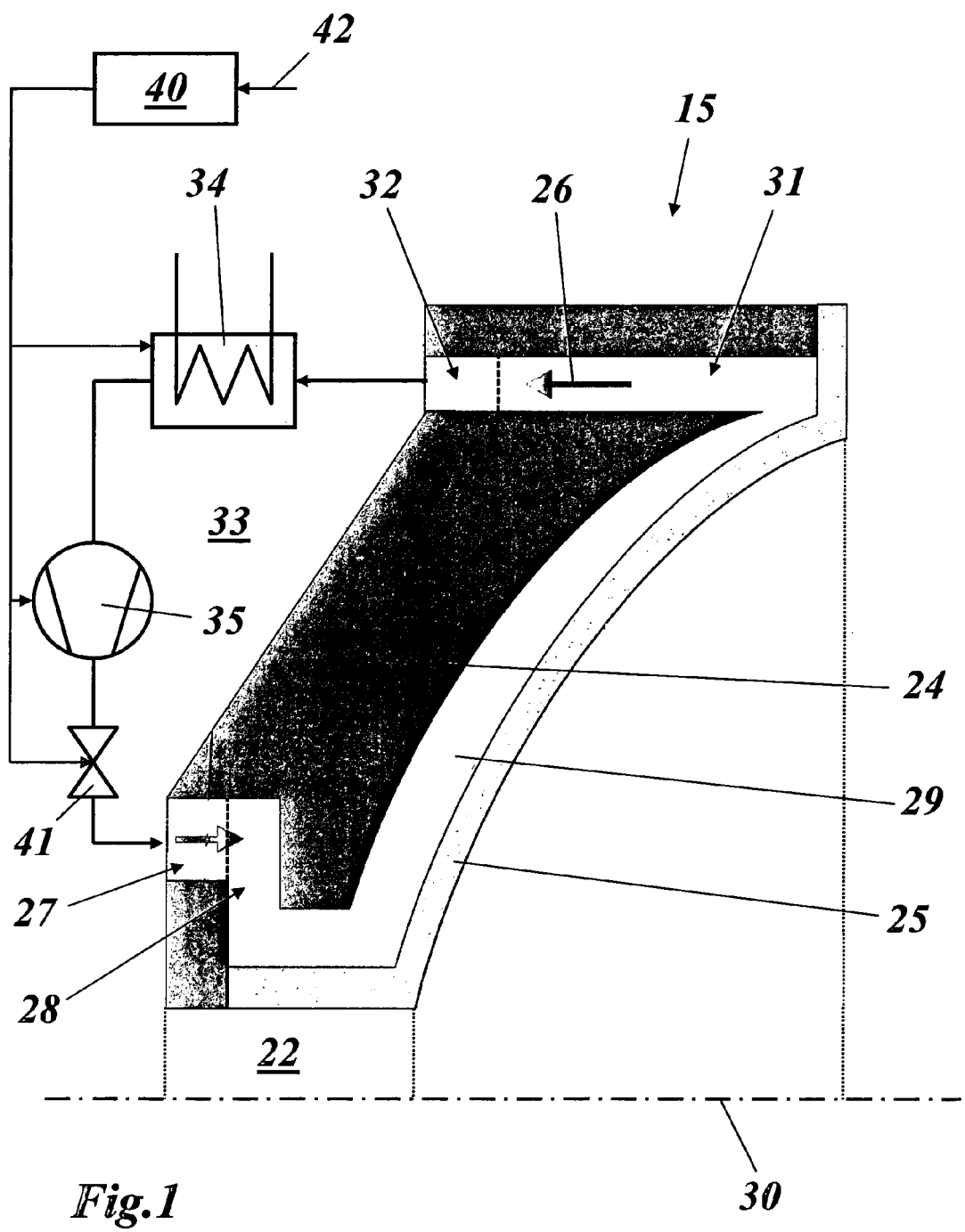
FIG. 1 shows a section view of the basic design of the collector, where a rigid support structure holds the thin reflective shell and a cooling channel for convective cooling based on a gas flow in between the shells.

This invention is about a cooling scheme for the thermo-mechanical management of ellipsoidal collector optics as they are used in EUV radiation sources. The purpose of this optics is to collect radiation coming from its plasma source and focus it to an intermediate focus. The invention comprises an approach to solve two major problems, which collector optics in EUV sources are facing: The heat load coming from the plasma leads to elevated material temperatures and temperature gradients across the collector, which induce deformations of the reflective surface of the collector. On the other hand the application of the collected radiation requires a very small spot size in the focus of the reflected radiation. This is to ensure a high brilliance of the radiation source. The induced deformations of the reflective shell of the collector compromise the required focusing quality of the collector.

The novel design and control strategy allow to adjust the temperature distribution in the collector material and to compensate for the thermally induced deformations: In a first step, the thickness of the reflective shell is substantially reduced, which leads to a dominating influence of convective heat transfer on the local temperature. Lateral distribution of heat by conduction is reduced, compared to heat transport across the thickness of the shell. This allows to locally influence the temperature by locally adjusting the convective heat transfer to the cooling medium (gas) on the back side. In regions with higher heat load, the local heat transfer is enhanced by flow acceleration, redirection or perturbation of the gas flow. Hence, approximately uniform temperature (+−1 [deg.] C.) of the reflective shell can be achieved despite the non-uniformly distributed heat load.

The thin design of the reflective shell on one hand and the stiffness of the support structure on the other hand only allow certain modes of deformation of the reflective shell. Finite Element simulations show that an increase in coolant pressure induces a local surface rotation, which is opposite to the local surface rotation induced by an increase in material temperature (decrease in coolant mass flow) over a large extent of the reflective surface. In other words, an increase in coolant pressure makes the ellipsoidal surface bulge in one direction, whereas an increase in material temperature induces deformations in the opposite direction, bringing the deformed contour closer to its non-deformed shape. This makes compensation of local surface rotation, which is detrimental for the focusing of the collected radiation down to a small spot, possible. Hereby, the pressure in a closed cooling loop of the collector has to match the required level to compensate for temperature induced deformations at the respective operating point. However, the shape of the reflective shell is not necessarily perfectly ellipsoidal. Some deformations due to operation conditions can be compensated in manufacturing already, Therefore, the "cold" shell is not perfectly ellipsoidal anymore.

The basic collector setup according to an embodiment of the invention is shown in FIG. 1. The collector 15 comprises an axisymmetric rigid support structure 24, which supports an axisymmetric reflective shell 25. A cooling medium 26 is injected into the collector support structure 24 at one or more inlet ports 27 arranged around the aperture 22 of the collector 15. In a first circumferential volute 28 the flow of the cooling medium 26 is distributed around the central axis 30, before it enters a funnel-shaped cooling channel 29 running along the back side of the reflective shell 25. After having passed the back side of the reflective shell 25, the cooling medium 26 is collected in a second circumferential volute 31, from which one or more exit ports 32 are releasing the cooling medium 26, which is a gas, back into a closed cooling circuit 33, which comprises at least a heat exchanging means 34 and a compressor 35. The pressure and/or the mass flow and/or the inlet temperature of the cooling medium 26. may be controlled by means of the compressor 35 and/or a control valve 41 and/or the heat exchanging means 34 being part of the cooling circuit 33. The operation of the compressor 35 and/or the control valve 41 and/or the heat exchanging means 34 is controlled by a control 40, which receives an input signal 42 (e.g. from temperature and/or deformation sensing means) being characteristic of the deformation of the reflective shell 25.

Figure 2:
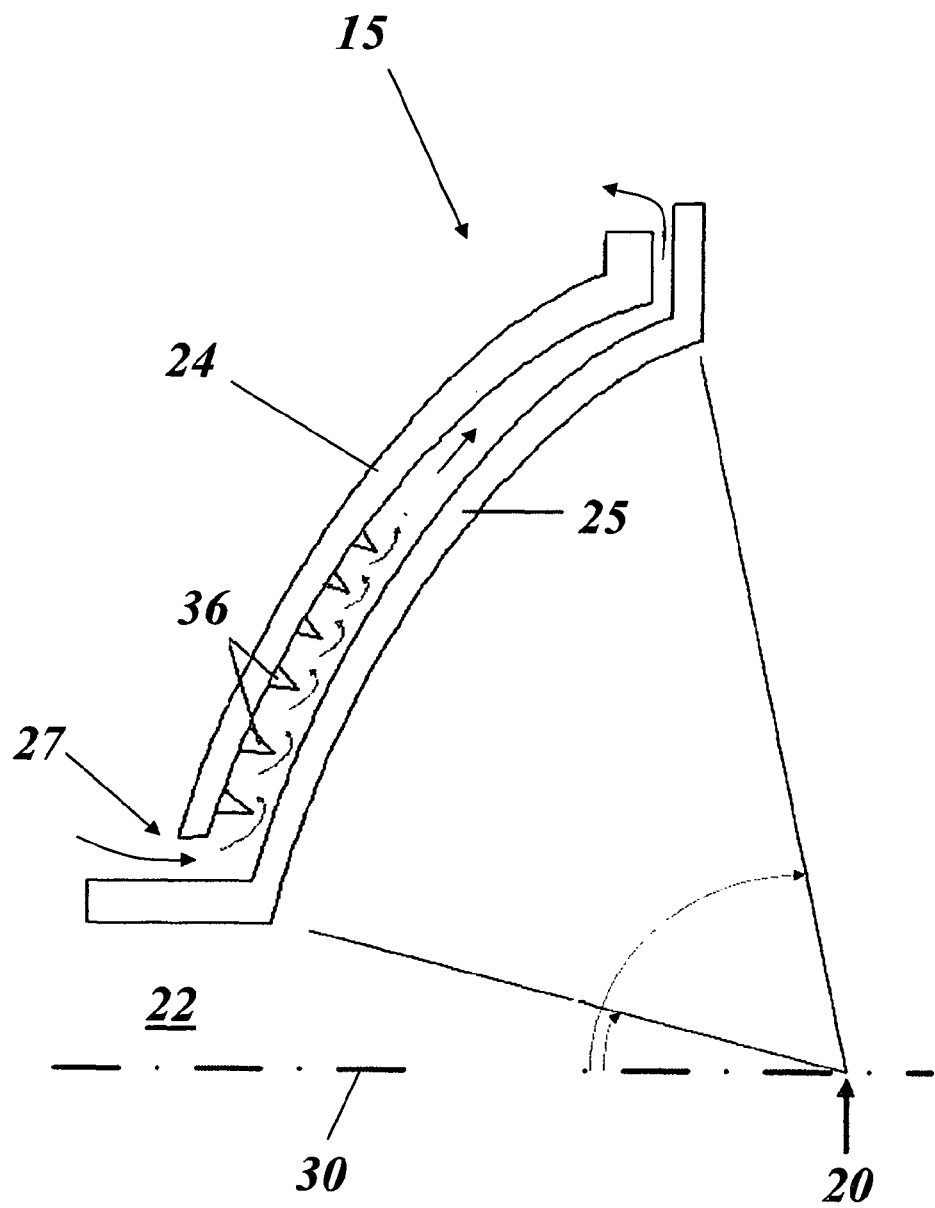
FIG. 2 explains the mechanism to adjust the cooling to a local heat load, whereby rib-like barriers in the cooling channel on the surface opposite to the collector shell enhance the heat transfer by perturbing, redirecting and accelerating the coolant flow.

The way to shape the temperature distribution of the collector 15 is depicted in FIG. 2. The section view indicates a cooling channel 29 of defined local width. Inserts in the form of ribs or turbulators 36 (wedge shaped in this case) are distributed on the inner surface of the support structure 24 at predetermined positions to accelerate and direct the cooling medium flow 26 towards the back side of the reflective shell 25. In the regions where these turbulators 36 are installed and act as barriers, the heat transfer from the back side of the reflective shell 25 to the flow of the cooling medium 26 is enhanced. Similar turbulators may also or alternatively provided on the back side of the reflective shell 25.

Figure 3:
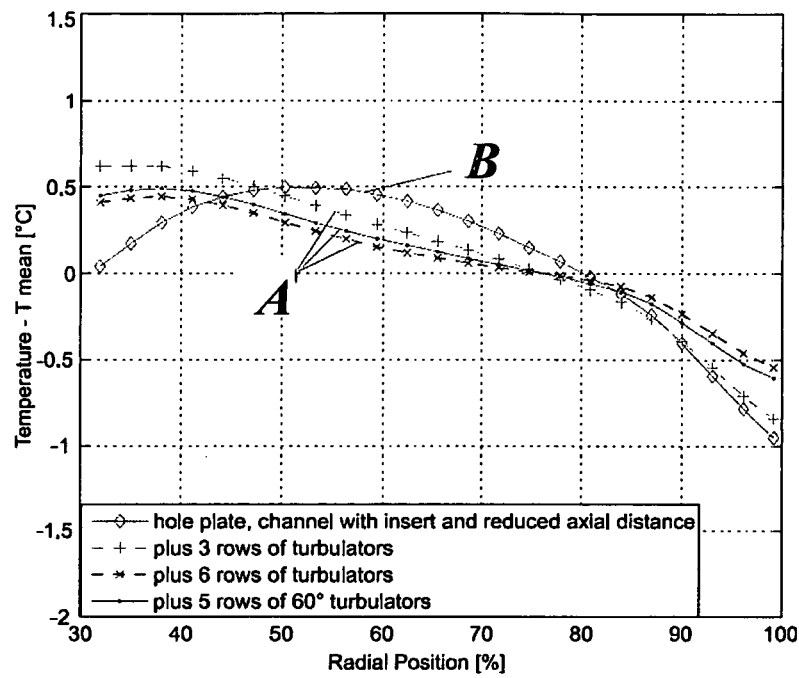
FIG. 3 proves the effectiveness of the rib enhanced heat transfer to shape the temperature profile across the collector.

FIG. 3 compares experimentally obtained radial temperature profiles (deviation from average temperature Tmean in dependence of the radial position) of the collector 15. The reduced temperature in regions with installed turbulators (curves A), compared to the original temperature profile (curve B) proves a cooling enhancement in those regions. The influence of different parameters like turbulator spacing, location, size and orientation to shape the temperature profile were investigated and can partially be seen in this figure, too.

Figure 4:
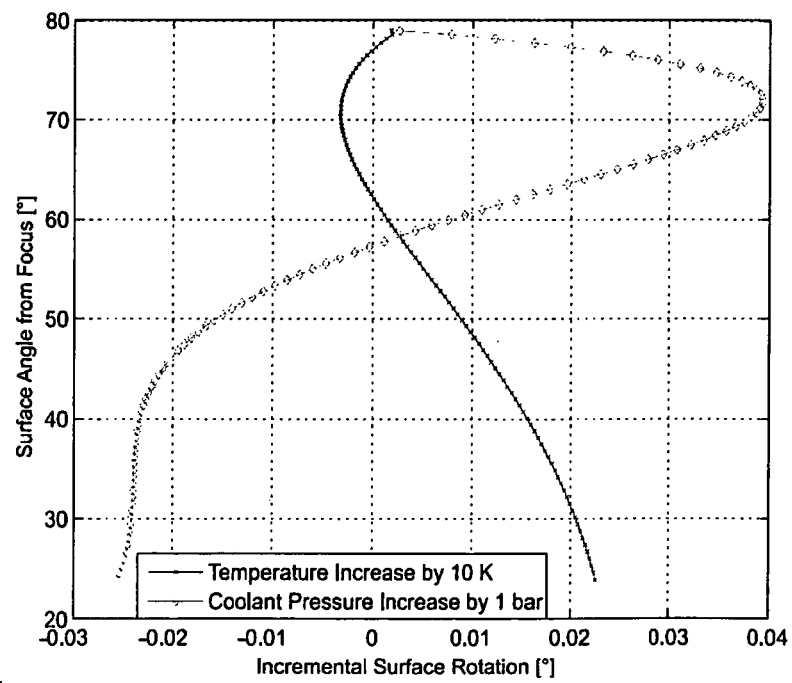
FIG. 4 quantifies the collector surface deformations for certain coolant pressure and material temperature changes.
Figure 5:
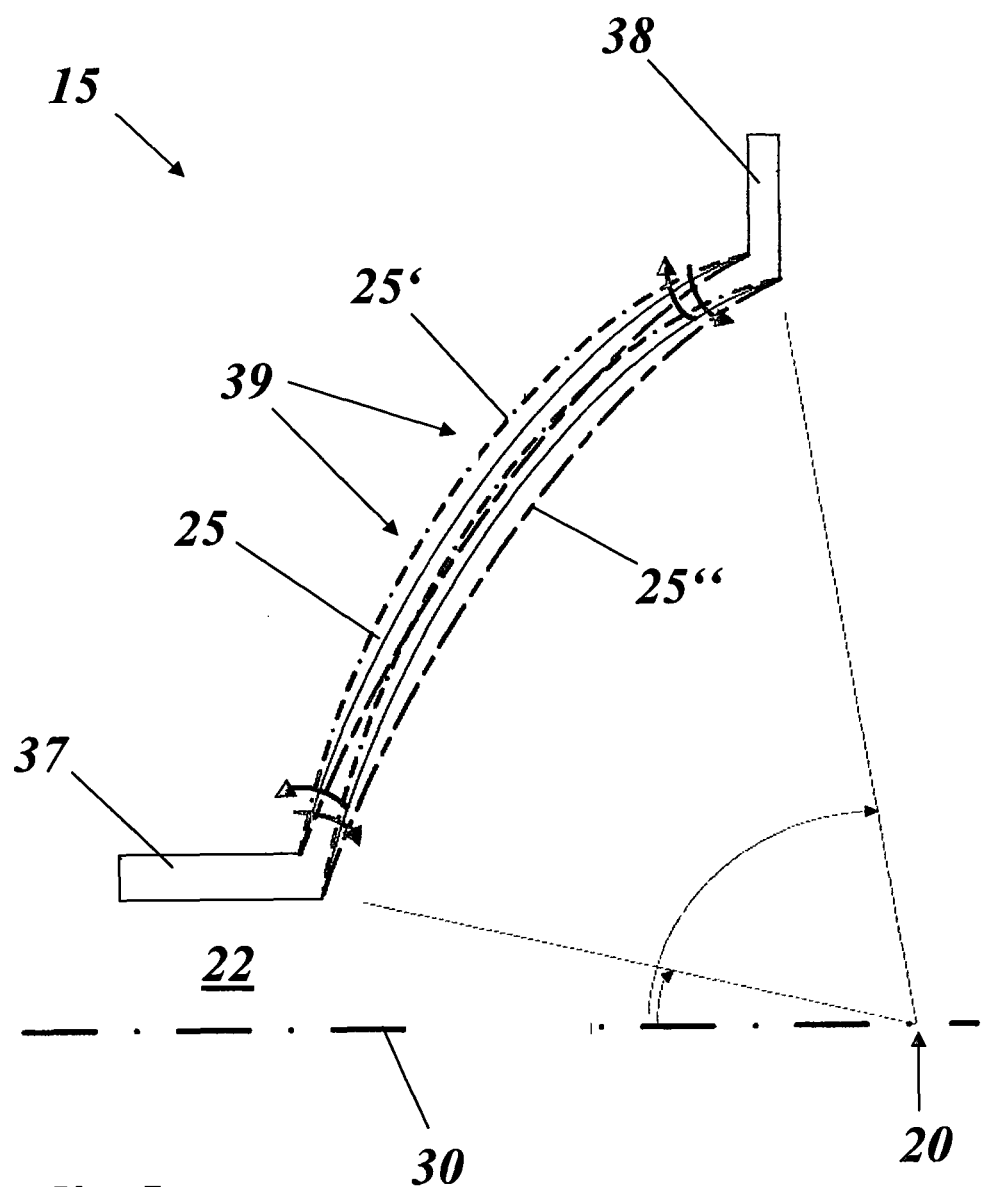
FIG. 5 illustrates the deformation modes of the thin collector shell due to temperature and coolant pressure influence.
Figure 6:
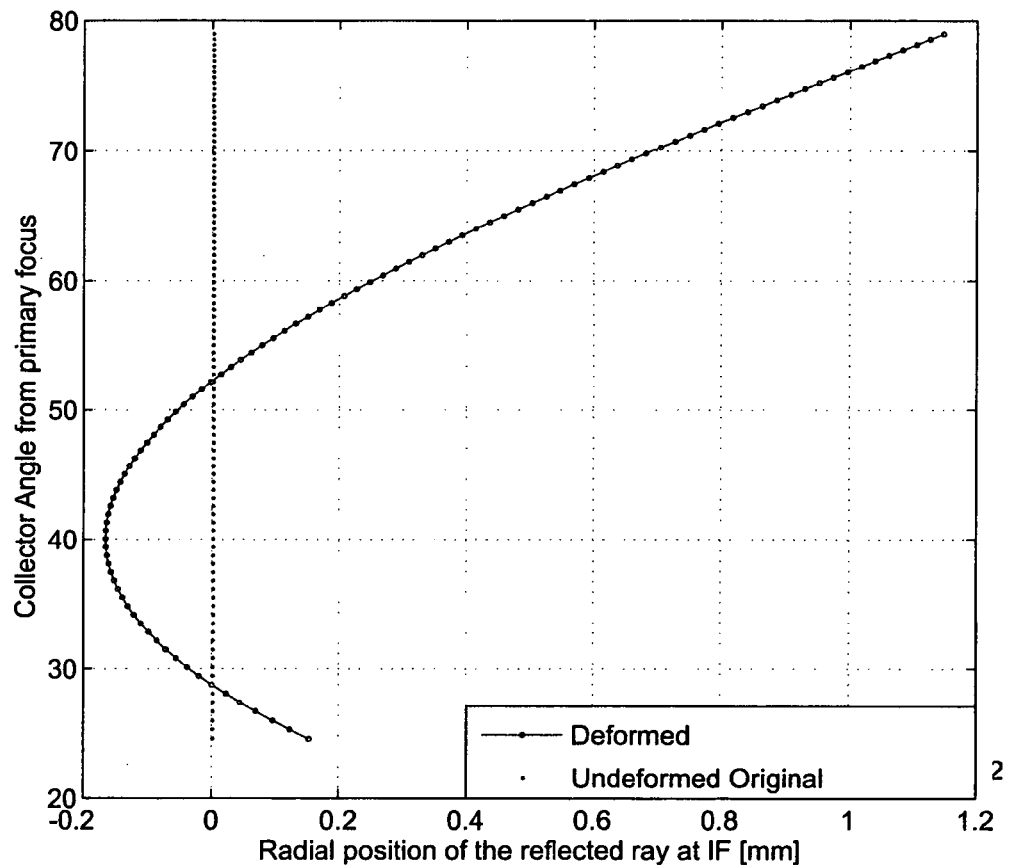
FIG. 6 shows the adverse effect of a deformed surface on the radius of the focal point to which the radiation is reflected.
Figure 7:
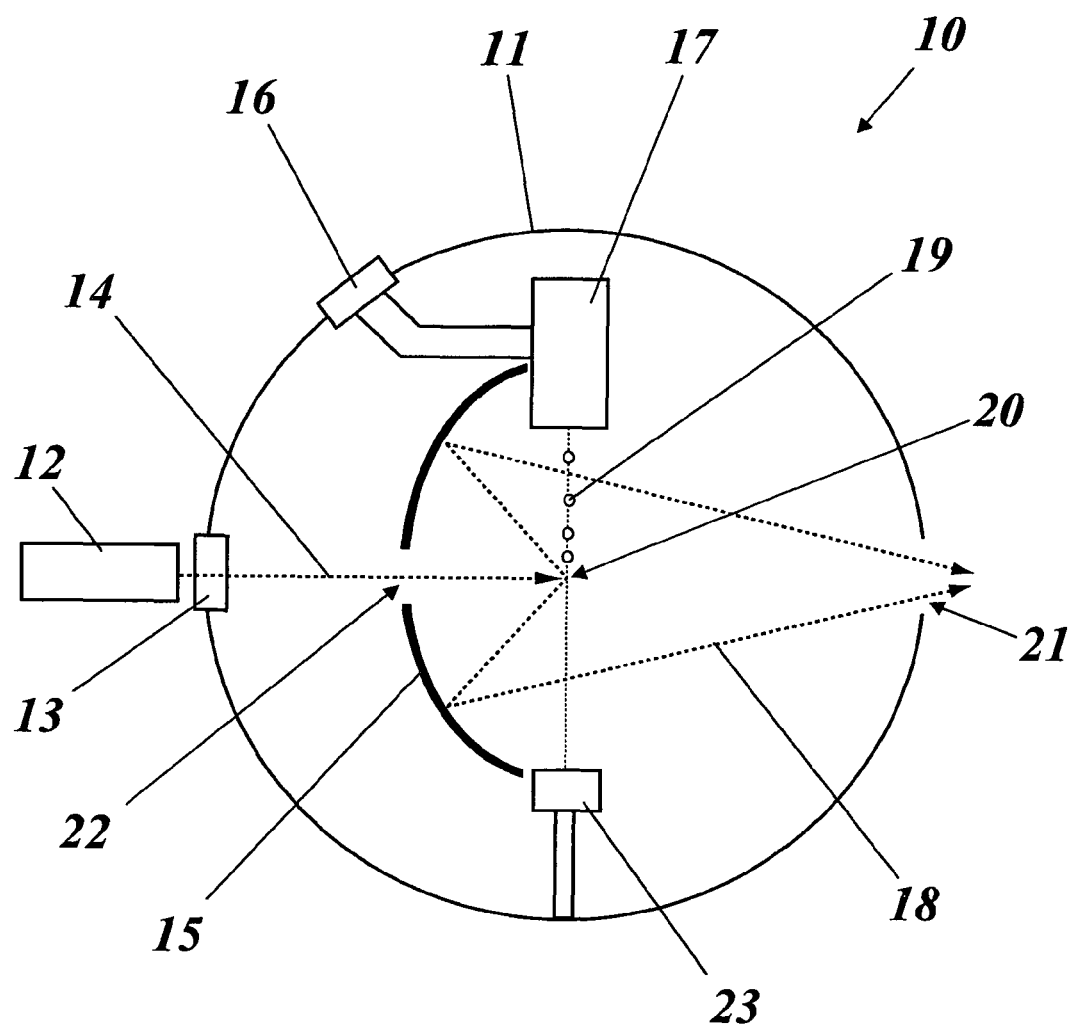
FIG. 7 shows a simplified configuration of a EUV source.

Deformation modes of the thin reflective shell 25 of the collector 15, as they are induced by substrate temperature and coolant pressure changes are indicated in FIG. 5 (the deformed shell is referenced by numerals 25' and 25"). The stiff or fixed regions close to the inner and outer support 37 and 38, respectively, are facing smaller deformations than the central ellipsoidal part 39 of the reflective shell 25. The shape of the deformations is such that, at a certain position the surface rotation due to an increased temperature (25') is opposite to the surface rotation, which is induced by increasing the coolant pressure (25"). The relative extent of these deformations is such that, depending on the radial position, up to 1 bar of coolant pressure increase is required to compensate an increase of 10 [deg.] C. in material temperature of the shell 25. This can be seen from FIG. 4, which shows the incremental surface rotation due to surface temperature and coolant pressure change for different surface angles. The reflective shell 25 may not necessarily have a uniform thickness. In some cases, it may be advantageous, that the thickness of the reflective shell 25 slightly varies over the shell surface in order to produce desired modes of thermally or mechanically induced deformations. How a deformed collector surface without compensation affects the spot size of the intermediate or second focus 21 of a EUV source 10 can be seen from the ray tracing results in FIG. 6. The reflected ray is deviated from the intermediate focus due to collector deformations up to 1.2 mm under operating conditions if a perfect ellipsoid is used as mirror geometry. Due to the thin design of the present solution a compensation of thermally induced deformations is indispensable to achieve a sufficiently small focus spot size.

Although the invention has been explained above in connection with EUV radiation, it may also be useful for X rays, i.e. in an overall wavelength range from 1 nm to 100 nm.

The invention claimed is:

1. An optical collector (15) for collecting extreme ultraviolet radiation or EUV light (18) generated at a central EUV production site (20), the collector (15) comprising:
   a reflective shell (25) including means for compensating thermally induced deformations of the reflective shell (25), wherein the reflective shell (25) is of near ellipsoidal shape and axisymmetric with respect to an axis (30);
   a support structure (24) supporting the reflective shell (25), such that a cooling channel (29) is established between a back side of the reflective shell (25) and the support structure (24), wherein the reflective shell (25) has a thickness, such that convective heat transfer between the back side of the reflective shell (25) and a cooling medium (26) flowing through the cooling channel (29) dominates the process of removing heat from the reflective shell (25) with respect to heat conduction, and wherein the cooling channel (29) is funnel-shaped with respect to the axis (30); and
   a cooling circuit (33) connected to the cooling channel (29) to supply a cooling medium (26) to the cooling channel (29) with a controlled coolant pressure and/or mass flow and/or temperature.

2. An optical collector according to claim 1, wherein the cooling channel (29) is connected to the cooling circuit (33) through a plurality of inlet ports (27) and exit ports (32).

3. An optical collector according to claim 2, wherein volutes (28, 31) are provided between the inlet ports (27) and the cooling channel (29) and the exit ports (32) and the cooling channel (29).

4. An optical collector according to claim 1, wherein the cooling medium (26) enters the cooling channel (29) near the axis (30) and exits the cooling channel (29) far from the axis (30).

5. An optical collector according to claim 1, wherein flow disturbing means (36) are provided at predetermined locations within the cooling channel (29).

6. An optical collector according to claim 5, wherein the flow disturbing means comprise a plurality of obstacles which are mounted on a side of the cooling channel (29) opposite to the back side of the reflective shell (25) and/or on the back side of the reflective shell (25).

7. An optical collector according to claim 1, wherein the cooling circuit (29) is a closed circuit comprising a heat exchanging means (34), a compressor (35) and a control valve (41), and a control (40) for controlling the compressor (35) and/or the control valve (41) and/or the heat exchanging means (34).

8. An optical collector according to claim 6, wherein the obstacles comprise a plurality of turbulators (36), which are mounted on a side of the cooling channel (29) opposite to the back side of the reflective shell (25) and/or on the back side of the reflective shell (25).

9. A EUV source (10) comprising:
a target delivery system (17), which emits a chain of droplets (19) of a target material, a high power drive laser (12), which ignites the target material at a EUV production site (20); and
an optical collector (15), which collects the EUV light (18) generated at the EUV production site (20), wherein the optical collector (15) is a collector according to claim 1.

10. A method for operating an optical collector for collecting extreme ultraviolet radiation or EUV light (18) generated at a central EUV production site (20), comprising: compensating thermally induced deformations of a reflective shell (25) using pressure and/or mass flow and/or temperature of a cooling medium (26) flowing through a cooling channel (29) to compensate for thermally induced deformations of the reflective shell (25), wherein the reflective shell (25) is of near ellipsoidal shape and axisymmetric with respect to an axis (30), and the cooling channel (29) is funnel-shaped with respect to the axis (30), wherein the collector comprises: a reflective shell (25), a support structure (24) supporting the reflective shell (25), such that a cooling channel (29) is established between a back side of the reflective shell (25) and the support structure (24), wherein the reflective shell (25) has a thickness, such that convective heat transfer between the back side of the reflective shell (25) and a cooling medium (26) flowing through the cooling channel (29) dominates the process of removing heat from the reflective shell (25) with respect to heat conduction; and a cooling circuit (33) connected to the cooling channel (29) to supply a cooling medium (26) to the cooling channel (29) with a controlled coolant pressure and/or mass flow and/or temperature.

11. The method according to claim 10, wherein the pressure and/or the mass flow and/or the temperature of the cooling medium (26) is controlled in dependence of an input signal (42) being characteristic of a deformation of the reflective shell (25).

12. The method according to claim 10, wherein a gas is used as the cooling medium.

13. The method according to claim 12, wherein the gas is one of the gases including hydrogen, helium, argon, neon, krypton, xenon, chlorine, nitrogen, fluorine, bromine, and iodine, or a mixture of two or more of said gases.

* * * * *